(12) United States Patent
Cheng et al.

(10) Patent No.: US 9,379,177 B2
(45) Date of Patent: Jun. 28, 2016

(54) DEEP TRENCH CAPACITOR

(71) Applicant: GLOBALFOUNDRIES Inc., Grand Cayman (KY)

(72) Inventors: Kangguo Cheng, Schenectady, NY (US); Joseph Ervin, Wappingers Falls, NY (US); Chengwen Pei, Danbury, CT (US); Ravi M. Todi, San Diego, CA (US); Geng Wang, Stormville, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 14/684,533

(22) Filed: Apr. 13, 2015

(65) Prior Publication Data
US 2015/0221715 A1   Aug. 6, 2015

Related U.S. Application Data

(62) Division of application No. 13/606,448, filed on Sep. 7, 2012, now Pat. No. 9,048,339.

(51) Int. Cl.
*H01L 27/108*  (2006.01)
*H01L 49/02*  (2006.01)
*H01L 21/84*  (2006.01)
*H01L 29/66*  (2006.01)
*H01L 27/12*  (2006.01)

(52) U.S. Cl.
CPC ............... *H01L 28/60* (2013.01); *H01L 21/84* (2013.01); *H01L 27/1087* (2013.01); *H01L 27/10829* (2013.01); *H01L 27/1203* (2013.01); *H01L 29/66181* (2013.01)

(58) Field of Classification Search
CPC ............ H01L 27/1087; H01L 27/0629; H01L 27/10861; H01L 29/945; H01L 21/76898; H01L 21/823864; H01L 27/108; H01L 29/76; H01L 29/94; H01L 27/945; H01L 21/20; H01L 21/311; H01L 21/8234; H01L 21/8244; H01L 21/8242
USPC .......................................... 257/301; 438/389
See application file for complete search history.

(56) References Cited

U.S. PATENT DOCUMENTS

| | | | |
|---|---|---|---|
| 6,472,702 B1 | 10/2002 | Shen | |
| 6,639,264 B1 | 10/2003 | Loh | |
| 6,852,575 B2 | 2/2005 | Bojarczuk, Jr. et al. | |
| 7,078,756 B2 | 7/2006 | Otani et al. | |
| 7,888,723 B2 | 2/2011 | Brodsky et al. | |
| 7,910,462 B2 | 3/2011 | Kelman | |
| 8,198,169 B2 | 6/2012 | Brodsky et al. | |
| 2008/0048232 A1 | 2/2008 | Su et al. | |
| 2008/0093645 A1* | 4/2008 | Sinitsky | H01L 27/1087 257/301 |
| 2008/0258268 A1* | 10/2008 | Cheng | H01L 21/84 257/622 |
| 2009/0236691 A1* | 9/2009 | Dyer | H01L 21/84 257/532 |
| 2009/0289291 A1 | 11/2009 | Cheng et al. | |
| 2010/0140755 A1 | 6/2010 | Atanackovic | |
| 2014/0070292 A1 | 3/2014 | Cheng et al. | |

* cited by examiner

*Primary Examiner* — Julia Slutsker
*Assistant Examiner* — Natalia Gondarenko
(74) *Attorney, Agent, or Firm* — Heslin Rothenberg Farley & Mesiti P.C.

(57) ABSTRACT

A deep trench capacitor structure including an SOI substrate comprising an SOI layer, a rare earth oxide layer, and a bulk substrate, the rare earth oxide layer is located below the SOI layer and above the bulk substrate, and the rare earth oxide layer insulates the SOI layer from the bulk substrate, and a deep trench capacitor extending from a top surface of the SOI layer, through the rare earth oxide layer, down to a location within the bulk substrate, the rare earth oxide layer contacts the deep trench capacitor at an interface between the rare earth oxide layer and the bulk substrate forming an incline away from the deep trench capacitor.

10 Claims, 5 Drawing Sheets

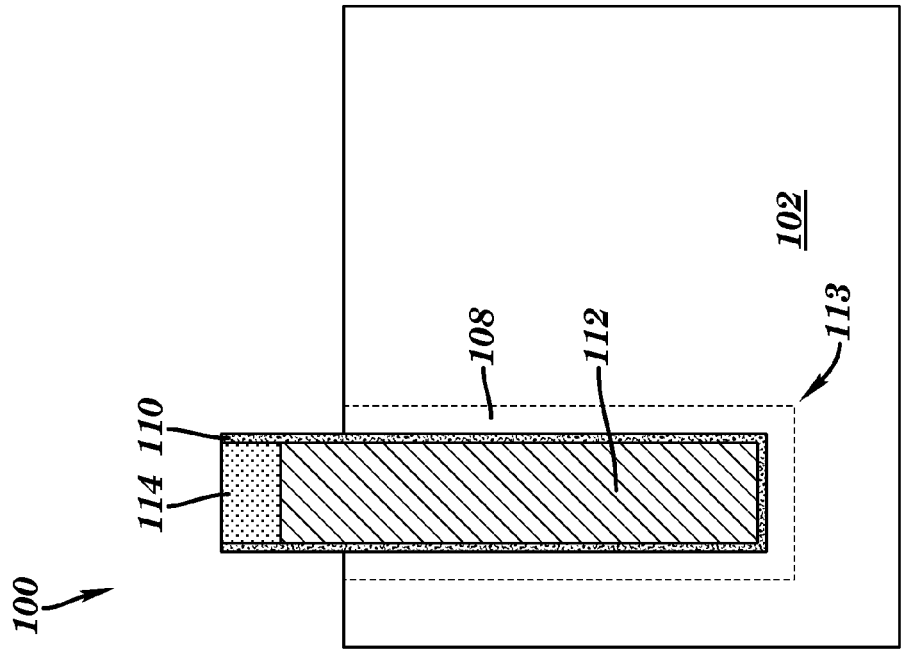
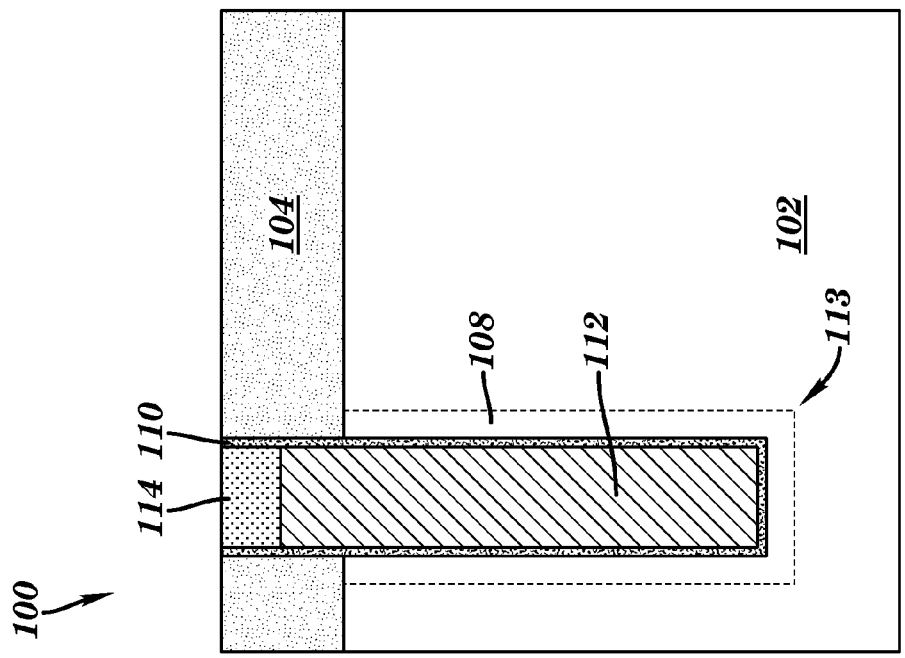
FIG. 3
FIG. 4

DEEP TRENCH CAPACITOR

BACKGROUND

The present invention relates to semiconductor structures, and particularly to a deep trench capacitor.

Deep trenches, typically having a depth exceeding 1 micron, in contrast to shallow trenches having a depth less than 1 micron, are employed in the semiconductor industry to provide a variety of useful devices including a deep trench capacitor. The deep trenches may be utilized in a stand-alone semiconductor circuit such as a dynamic random access memory (DRAM) circuit to provide deep trench capacitors, or may be utilized as an embedded circuit component of a semiconductor chip that also includes other semiconductor circuits such as a processor core or other logic circuits. Particularly, embedded deep trench capacitors may be used to enable an embedded memory device, for example, an embedded dynamic random access memory (eDRAM) cell, a passive component of a radio frequency (RF) circuit, or a decoupling capacitor that provides a stable voltage supply in a semiconductor circuit.

Semiconductor-on-insulator (SOI) substrates are employed in the semiconductor industry for performance benefits due to reduced capacitive coupling between semiconductor devices and the bulk portion of the substrate. The reduced capacitive coupling may be provided by a buried insulator layer. The buried insulator layer separates a bulk substrate below from a SOI layer above and may include any of several known dielectric materials, for example, oxides, nitrides and oxynitrides of silicon. The SOI layer may be considered the active layer where semiconductor devices may be formed. High performance logic chips are frequently manufactured on a SOI substrate to provide enhanced performance over devices having comparable dimensions and manufactured on a bulk substrate.

Generally, deep trench capacitors may include two electrical conductors separated by an insulator. One electrical conductor, commonly referred to as a buried plate, may typically be formed in the bulk substrate. The insulator, which may be referred to as a node dielectric, may be formed within the deep trench on top of the buried plate. The other electrical conductor, which may be referred to as an inner electrode, may be formed within the deep trench on top of the node dielectric. Therefore, the deep trench capacitor may include the inner electrode and the buried plate separated by the node dielectric. The conductors, for example the buried plate and the inner electrode, may preferably be very conductive.

Typical fabrication of a deep trench capacitor may begin by etching a deep trench in a pre-existing SOI substrate. The buried plate, the node dielectric, and the inner electrode may then be formed within the deep trench to form the deep trench capacitor. The buried plate may typically be formed from a portion of the bulk substrate below the buried insulator layer. Doing so may present challenges because the bulk substrate, which may typically include undoped silicon having poor conductivity, must be heavily doped to form the very conductive buried plate. Careful attention must be paid not to introduce unwanted dopants into the SOI layer above the buried insulator layer. It may be desirable to prevent the diffusion of unwanted dopants into the SOI layer, a active layer, because the diffusion of unwanted dopants may caused detrimental effects, if not failures, to the semiconductor devices subsequently formed in the SOI layer. Therefore, special techniques may be used to mask or protect the SOI layer during doping of the bulk substrate to form the buried plate.

In view of the above, methods of manufacturing a deep trench capacitor in a SOI substrate while minimizing or eliminating the risk of introducing dopants in the SOI layer may be desirable.

SUMMARY

According to one embodiment of the present invention, a method of forming a deep trench capacitor in a semiconductor-on-insulator substrate is provided. The method may include providing a pad layer positioned above a bulk substrate, etching a deep trench into the pad layer and the bulk substrate extending from a top surface of the pad layer down to a location within the bulk substrate; the deep trench having a sidewall and a bottom, and doping a portion of the bulk substrate located along the sidewall and the bottom of the deep trench to form a buried plate, the buried plate being conductive. The method may also include depositing a node dielectric, an inner electrode, and a dielectric cap substantially filling the deep trench, the node dielectric being located between the buried plate and the inner electrode, the dielectric cap being located at a top of the deep trench, removing the pad layer, growing an insulator layer on top of the bulk substrate, and growing a semiconductor-on-insulator layer on top of the insulator layer.

According to another exemplary embodiment, a deep trench capacitor structure is provided. The deep trench capacitor structure may include a silicon-on-insulator (SOI) substrate including a SOI layer, a rare earth oxide layer, and a bulk substrate; wherein the rare earth oxide layer is located below the SOI layer and above the bulk substrate, and wherein the rare earth oxide layer insulates the SOI layer from the bulk substrate, a deep trench capacitor extending from a top surface of the SOI layer, through the rare earth oxide layer, down to a location within the bulk substrate, and where the rare earth oxide layer contacts the deep trench capacitor at an interface between the rare earth oxide layer and the bulk layer forming an incline away from the deep trench capacitor.

BRIEF DESCRIPTION OF THE SEVERAL VIEWS OF THE DRAWINGS

The following detailed description, given by way of example and not intend to limit the invention solely thereto, will best be appreciated in conjunction with the accompanying drawings, in which:

FIGS. 1-8 illustrate the steps of a method of forming a memory device structure according to an exemplary embodiment.

FIG. 1 depicts the formation of a deep trench in a pad layer and a bulk substrate according to an exemplary embodiment.

FIG. 2 depicts the formation of a doped buried plate, a node dielectric, and an inner electrode according to an exemplary embodiment.

FIG. 3 depicts the removal of a portion of the inner electrode and the subsequent deposition of a dielectric cap according to an exemplary embodiment.

FIG. 4 depicts the removal of the pad layer according to an exemplary embodiment.

FIG. 5 depicts the formation of a rare earth oxide layer and the deposition of a semiconductor-on-insulator layer according to an exemplary embodiment.

FIG. 6 depicts the formation of dielectric isolation according to an exemplary embodiment.

FIG. 7 depicts the structure having multiple semiconductor devices according to an exemplary embodiment.

FIG. 8 depicts the formation of contacts to the various semiconductor devices of the structure according to an exemplary embodiment.

DETAILED DESCRIPTION

Figure 2:
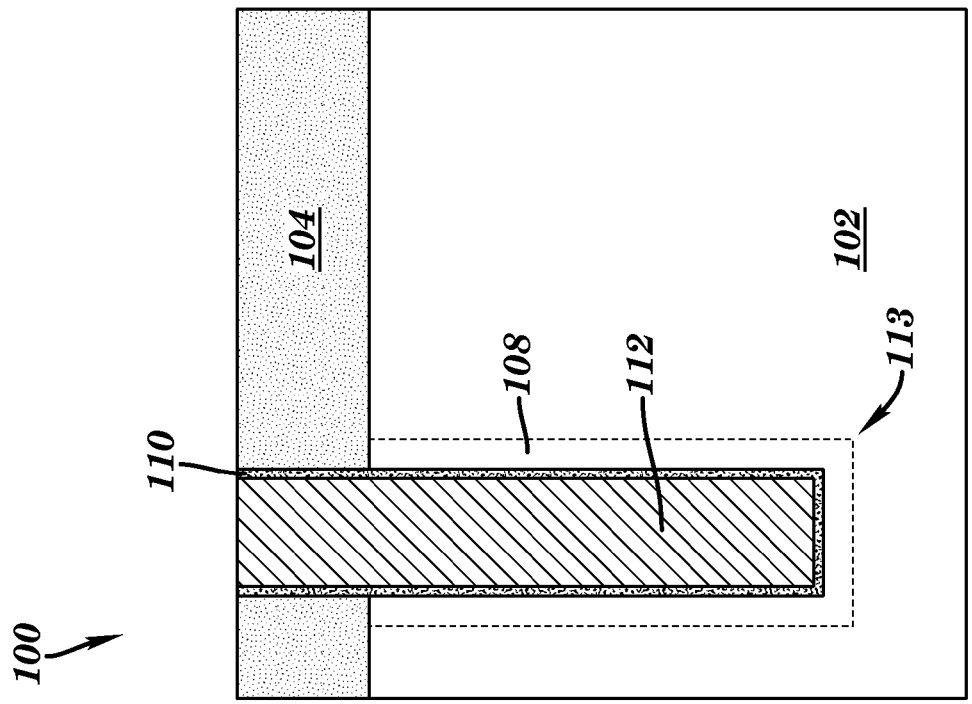

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The drawings are not necessarily to scale. The drawings are merely schematic representations, not intended to portray specific parameters of the invention. The drawings are intended to depict only typical embodiments of the invention. In the drawings, like numbering represents like elements.

Referring now to FIGS. 1-8, exemplary process steps of forming a deep trench capacitor having a heavily doped buried plate in accordance with one embodiment of the present invention are shown, and will now be described in greater detail below. Fabrication of the deep trench capacitor may begin with a bulk substrate. First a deep trench may be etched in a bulk substrate to form an etched opening. The heavily doped buried plate may then be formed in the etched opening. Next, a node dielectric followed by an inner electrode and a dielectric cap may be formed substantially filling the deep trench. After the heavily doped buried plate, the node dielectric, the inner electrode, and the dielectric cap are formed an insulator layer (for example a rare earth oxide (REO) layer) and a semiconductor-on-insulator (SOI) layer may be epitaxially grown on the surface of the bulk substrate. The combination of the bulk substrate, the ROE layer, and the SOI layer may form the equivalent of a traditional SOI substrate where the REO layer may function as a buried insulator layer and the SOI layer may function as the active layer. It should be noted that FIGS. 1-8 all represent a cross section view of a semiconductor structure ("structure 100").

Figure 1:
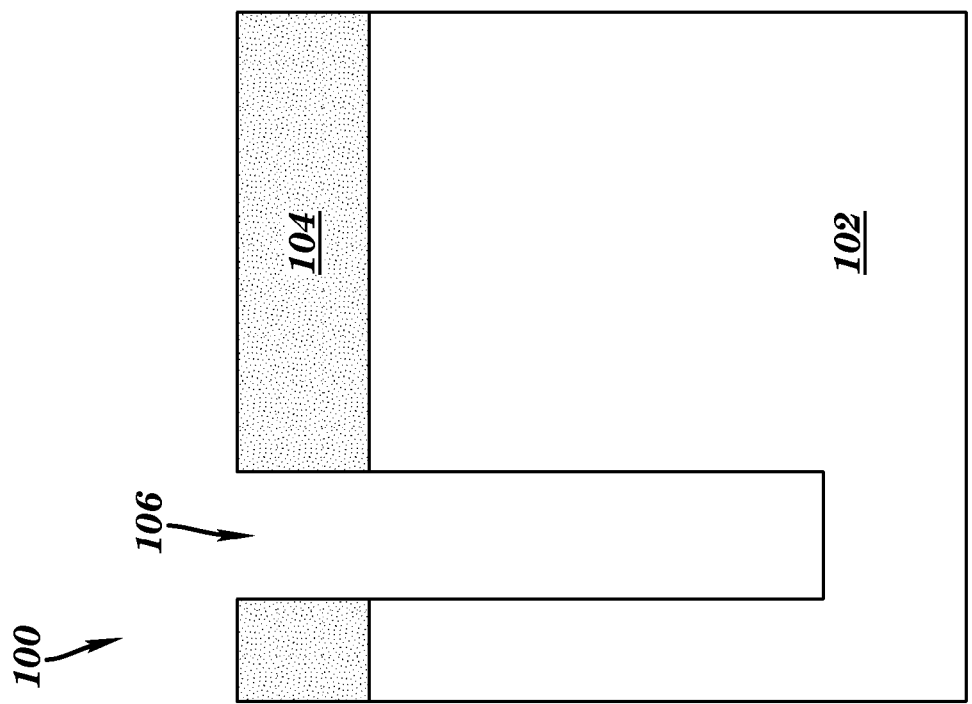

Referring to FIG. 1, the structure 100 according to one exemplary embodiment is shown. The structure 100 may include a bulk substrate 102 and a pad layer 104. The bulk substrate 102 used in the present embodiment may be made from any of several known semiconductor materials such as, for example, silicon, germanium, a silicon-germanium alloy, a silicon carbon alloy, a silicon-germanium-carbon alloy, gallium arsenide, indium arsenide, indium phosphide, III-V compound semiconductor materials, II-VI compound semiconductor materials, organic semiconductor materials, and other compound semiconductor materials. Typically the bulk substrate 102 may be about, but is not limited to, several hundred microns thick. For example, the bulk substrate 102 may have a thickness ranging from 0.5 mm to about 1.5 mm.

The pad layer 104 may include a dielectric nitride. For example, the pad layer 104 may include silicon nitride, which may be formed by chemical vapor deposition, such as for example, low pressure chemical vapor deposition (LPCVD), rapid thermal chemical vapor deposition (RTCVD), plasma enhanced chemical vapor deposition (PECVD), and high density plasma chemical vapor deposition (HDPCVD). The thickness of the pad layer 104 may range from about 40 nm to about 300 nm, and typically from about 80 nm to about 150 nm, although lesser and greater thickness may be contemplated. The pad layer 104 may protect the bulk substrate 102 from subsequent fabrication processes.

A deep trench 106 may then be formed using known patterning techniques, such as for example, a lithography process followed by etching process. The term "deep trench" denotes a trench formed in a semiconductor substrate having a sufficient depth to form a capacitor. As such, a deep trench may typically denote a trench having a depth equal to or greater than 1 micron, whereas a shallow trench may typically refer to a trench having a depth less than 1 micron. While the present embodiment may be described with a deep trench, the present embodiment may be employed with a trench having any depth into the bulk substrate 102. Such variations are explicitly contemplated herein.

The lithography technique may include applying a photoresist (not shown) to an upper surface of the pad layer 104, exposing the photoresist to a desired pattern of radiation and developing the exposed photoresist utilizing a conventional resist developer. The pattern in the photoresist may then be transferred to the pad layer 104 and the bulk substrate 102 using one or more dry etching techniques to form the deep trench 106. Suitable dry etching techniques may include, but are not limited to: reactive ion etching (RIE), ion beam etching, plasma etching, or laser ablation. The patterned photoresist may then be removed by resist stripping after etching has been completed. In one embodiment, a hardmask layer, such as an oxide (not shown), may be deposited on top of the pad layer 104 to facilitate the formation of the deep trench. The hardmask layer may be removed after the formation of the deep trench.

Referring to FIG. 2, a deep trench capacitor 113 may be formed in the deep trench 106, FIG. 1. The deep trench capacitor 113 may include a buried plate 108, a node dielectric 110, and an inner electrode 112. The buried plate 108 and the inner electrode 112 may serve as the two electrical conductors and the node dielectric 110 may serve as the insulator between the two conductors.

A blanket doping technique may be used to form the buried plate 108. Suitable doping techniques may include, but are not limited to, ion implantation, gas phase doping, plasma doping, plasma immersion ion implantation, cluster doping, infusion doping, liquid phase doping, solid phase doping, or any suitable combination of those techniques. In one embodiment, dopants may be implanted by one or more rounds of angled ion implantation to dope the sidewalls and the bottom of the deep trench 106, FIG. 1. In doing so, dopants may be introduced into the bulk substrate 102 to form the buried plate 108. Typical dopants may include As, P, Sb, B, Ga, and In. The pad layer 104 may protect the top surface of the bulk substrate 102 from being doped by the ion implantation. Because of the pad layer 104, no special techniques may be required to mask or protect the bulk substrate 102 from the diffusion of unwanted dopants.

During the multiple rounds of angled ion implantation, the direction and the tilt of the implanted ions may be changed so that the buried plate 108 surrounds the perimeter of the deep trench 106, FIG. 1, at any depth between the bottom surface of the pad layer 104 and the bottom surface of the deep trench 106, FIG. 1. The angle of implantation, as measured from a vertical line, may range from about 1 degree to about 5 degrees, and typically from 2 degrees to about 3 degrees, although lesser and greater angles may be explicitly contemplated. The dose and energy of the angled ion implantation may be selected to provide a sufficiently high dopant concentration and volume to the buried plate 108, which may be typically expanded during subsequent thermal treatments.

Typical dopant concentration of the buried plate 108 after thermal treatments may range from about $1.0 \times 10^{18}/cm^3$ to about $1.0 \times 10^{21}/cm^3$, although higher and lower dopant concentrations may be explicitly contemplated.

Lateral thickness of the buried plate 108, as measured from the sidewall of the deep trench 106, FIG. 1, to an outer wall of the buried plate 108, prior to a thermal treatment, may range from about 5 nm to about 100 nm, and typically from about 10 nm to about 50 nm, although lesser and greater thicknesses may be explicitly contemplated. Lateral thickness of the buried plate 108, after a thermal treatment, may range from about 5 nm to about 300 nm, and typically from about 10 nm to about 150 nm, although lesser and greater thicknesses mat be explicitly contemplated.

With continued reference to FIG. 2, the node dielectric 110 may then be formed within the deep trench 106, FIG. 1, and directly on the buried plate 108 and the sidewalls of the pad layer 104. The node dielectric 110 may include a dielectric such as silicon oxide, silicon nitride, silicon oxynitride. The thickness of the node dielectric 110 may range from about 2 nm to about 6 nm. Alternately, the node dielectric 110 may include a high-k material having a dielectric constant greater than the dielectric constant of silicon nitride, which is about 7.5. Exemplary high-k materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x may independently range from about 0.5 to about 3 and each value of y may independently range from 0 to about 2. In this case, the thickness of the node dielectric 110 may range from about 2 nm to about 4 nm, although lesser and greater thickness may be contemplated. In one embodiment, the node dielectric 110 may include a combination of multiple materials.

Next, the inner electrode 112 may be formed by depositing a conductive material on the inner walls of the node dielectric 110. The inner electrode 112 may be a doped semiconductor material or a metal. If the inner electrode 112 is a doped semiconductor material, the doped semiconductor material may include any material listed above for the bulk substrate 102. The dopants may be a p-type dopant or an n-type dopant. The doped semiconductor material may be deposited by chemical vapor deposition such as low pressure chemical vapor deposition (LPCVD).

If the inner electrode 112 is an elemental metal, exemplary elemental metals may include Ta, Ti, Co, and W. Alternatively, inner electrode 112 may be a conductive metallic alloy, and exemplary conductive metallic alloys may include a mixture of elemental metals, a conductive metallic nitride such as TiN, ZrN, HfN, VN, NbN, TaN, WN, TiAlN, TaCN, and an alloy thereof. The inner electrode 112 may be formed by known suitable deposition techniques, for example, chemical vapor deposition (CVD), physical vapor deposition (PVD), or atomic layer deposition (ALD).

Excess conductive material that may be deposited outside the deep trench 106, FIG. 1, may be removed by a recess etch or chemical mechanical planarization. The node dielectric 110 or the pad layer 104 may be used to sense an endpoint during the recess etch, or alternately, may be employed as a stopping layer during the chemical mechanical planarization.

Referring now to FIG. 3, once the excess conductive material is removed from outside the deep trench 106, FIG. 1, a dielectric cap 114 may be formed at the top of the deep trench capacitor 113. Preferably, the dielectric cap 114 is an oxide and may be formed by suitable etching and deposition techniques known in the art. First, the inner electrode 112 may be recessed by a suitable wet or a dry etching technique. The inner electrode 112 may be recessed selective to the node dielectric 110. Suitable dry etching techniques may include, but are not limited to: reactive ion etching (RIE), ion beam etching, plasma etching, or laser ablation. Second, the dielectric cap 114 may be deposited within the recessed opening.

The dielectric cap 114 may include a dielectric oxide such as silicon oxide, silicon oxynitride, or high-k materials. The dielectric cap 114 may be formed by any known suitable deposition technique, for example, thermal oxidation, chemical vapor deposition (CVD), physical vapor deposition (PVD), or atomic layer deposition (ALD). In one embodiment, the thickness of the dielectric cap 114 may range from about 10 nm to about 100 nm, and typically from about 30 nm to about 60 nm, although lesser and greater thicknesses may be explicitly contemplated.

Referring now to FIG. 4, the pad layer 104 may be selectively removed using a suitable wet or dry etching technique. The etching technique used may be selective to the node dielectric 110 and the dielectric cap 114. In one embodiment, the etching technique may be selective to oxide and high-k dielectric, and use a hot phosphoric acid to remove the pad layer 104 selective to the node dielectric 110 and the dielectric cap 114.

Figure 5:
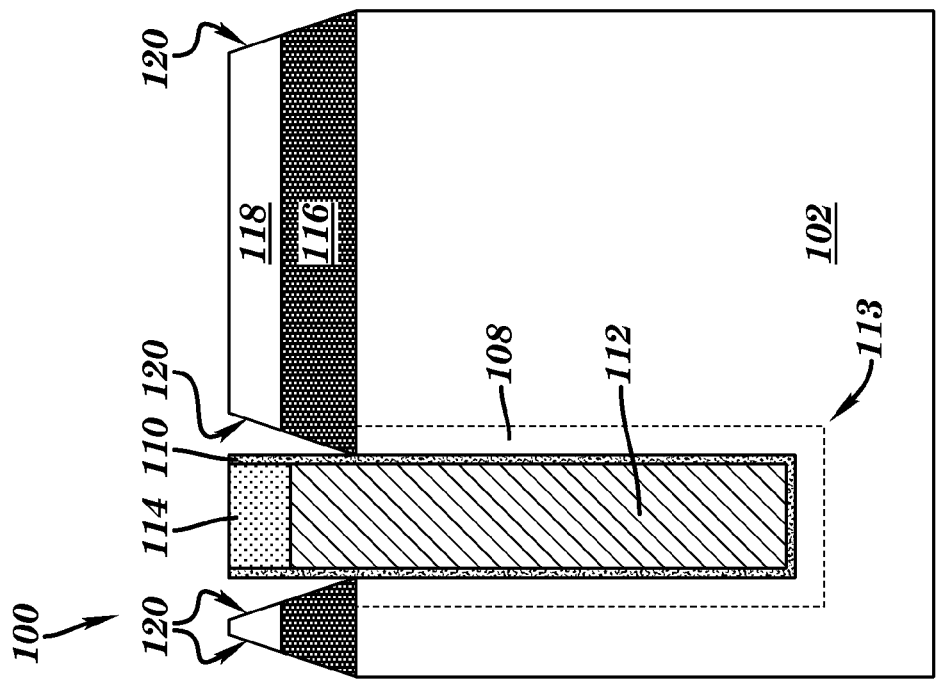

Referring now to FIG. 5, a substrate insulation layer 116 and a semiconductor-on-insulator (SOI) layer 118 may be formed on the surface of the bulk substrate 102 with the SOI layer 118 being located above the substrate insulation layer 116. The substrate insulation layer 116 may include any epitaxially grown insulator that supports the subsequent epitaxial growth of the SOI layer 118 on its surface. Thus, the epitaxially grown insulator layer, for example the substrate insulator layer 116, shall have the correct crystalline structure by which to support the subsequent growth of an active layer, for example the SOI layer 118, on the insulator layer. In one embodiment, the substrate insulation layer 116 may include any known suitable rare earth oxide that which may be formed by epitaxial growth. Known suitable rare earth oxides may include, for example, cadmium oxide ($Cd_2O_3$), yttrium oxide ($Y_2O_3$), scandium oxide ($Sc_2O_3$), cerium oxide ($CeO_2$), lanthanum oxide ($La_2O_3$), praseodymium oxide ($Pr_2O_3$), thorium oxide ($ThO_2$), or actinium oxide ($Ac_2O_3$), or any combination thereof. However, other rare-earth oxide materials are explicitly contemplated. In one embodiment, the substrate insulation layer 116 may be epitaxially grown using methods known in the art such as, for example, electron beam evaporation, molecular beam evaporation, or chemical vapor deposition. When epitaxially formed on a silicon substrate, for example the bulk substrate 102, the substrate insulation layer 116 may have a similar crystallographic orientation as the silicon substrate. In one embodiment, the substrate insulation layer 116 may have a thickness ranging from about 5 nm to about 500 nm, although lesser and greater thickness may be contemplated. More preferably, the substrate insulation layer 116 may have a thickness of about 25 nm.

Next, the SOI layer 118 may be formed on the surface of the substrate insulation layer 116. The SOI layer 118 may include any epitaxially grown film that shall have a similar crystalline structure to that of the substrate insulation layer 116. In one embodiment, the SOI layer 118 may include any of the several known semiconductor materials included in the bulk substrate 102. In general, the bulk substrate 102 and the SOI layer 118 may have either identical or different semiconducting materials with respect to chemical composition and dopant concentration; however the bulk substrate 102 and the SOI layer 118 may have similar crystallographic orientations. In one embodiment, the SOI layer 118 may be epitaxially grown using methods known in the art such as, for example, chemical vapor deposition, electron beam evaporation or molecular beam evaporation. When epitaxially grown on a rare earth oxide, for example the substrate insulation layer 116, the SOI layer 118 may have a similar crystallographic orientation as the rare earth oxide. In one embodiment, the SOI layer 118 may have a thickness ranging from about 3 nm to about 10 nm, although lesser and greater thickness may be contemplated. More preferably, the SOI layer 118 may have a thickness of about 5 nm.

The bulk substrate 102, the substrate insulation layer 116, and the SOI layer 118 together form an SOI substrate. Because the SOI 118 layer was formed subsequent to the doping process required to form the buried plate 108 risk of contaminating the SOI layer 118 with unwanted dopants may be reduced. However, a person having ordinary skill in the art may recognize that the SOI layer 118 may only be epitaxially grown, and in order to do so the substrate insulation layer 116 shall too be epitaxially grown.

It may be recognized by a person having ordinary skill in the art that epitaxial growth of the substrate insulation layer 116 and the SOI layer 118 may result in inclined, or non-vertical, edges. These inclined edges are identified as edges 120 in the figure. The inclines, for example edges 120, may be characteristic of epitaxial growth and not characteristic of a deposited layer. It should be noted, however, that the edges 120 may be engineered to be near vertical. Therefore, not all epitaxially grown layers will have inclined edges, like the edges 120.

Figure 6:
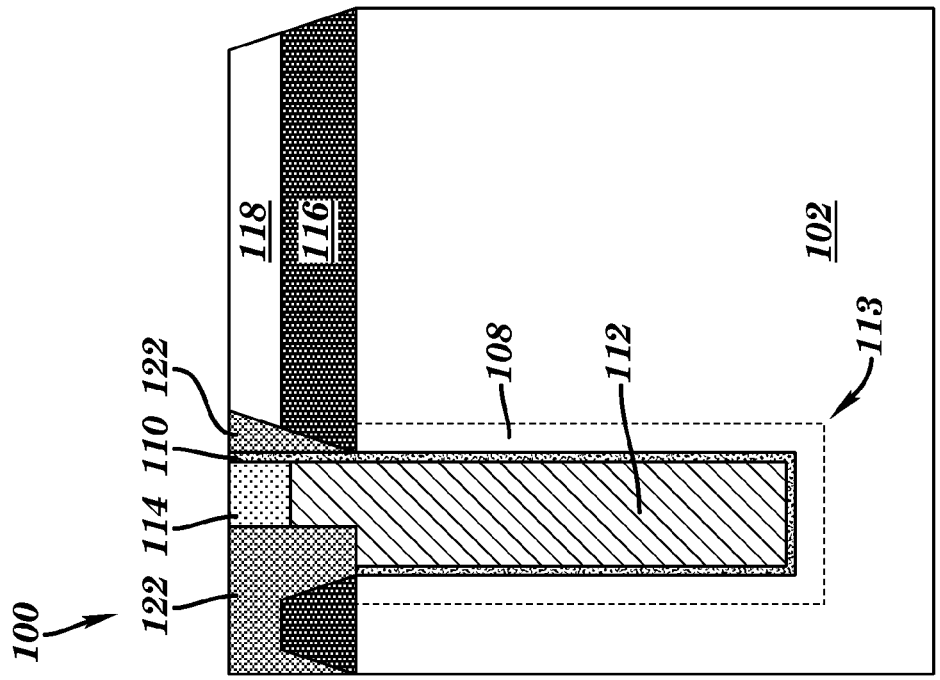

Referring now to FIG. 6, a dielectric isolation region 122 may be formed in the SOI layer 118 to isolate the deep trench capacitor 113 from adjacent devices that may be subsequently formed. The dielectric isolation region 122 may be typically formed using trench isolation techniques that are well known to a person of ordinary skill in the art including, for example, forming a patterned mask on the surface of the substrate via lithography, etching a trench into the substrate thru an opening in the patterned mask, filling the trench with a trench dielectric such as silicon oxide or TEOS, and planarizing the structure. In one embodiment, a portion of the deep trench capacitor 113 may be removed during etching the trench. Therefore, in one embodiment, the dielectric isolation region 122 may encroach into the deep trench capacitor 113, as shown in the figure. An optional trench liner can be formed within the trench prior to trench dielectric fill and an optional densification step may follow the planarization process. It may be recognized by one skilled in the art that the trench dielectric may also be deposited in the open spaced formed by the edges 120, FIG. 5. Furthermore, it should be noted that the dielectric isolation region 122 is depicted on the left of the deep trench capacitor 113, and the semiconductor device may be subsequently depicted on the right of the deep trench capacitor 113, see FIGS. 7 and 8.

Figure 7:
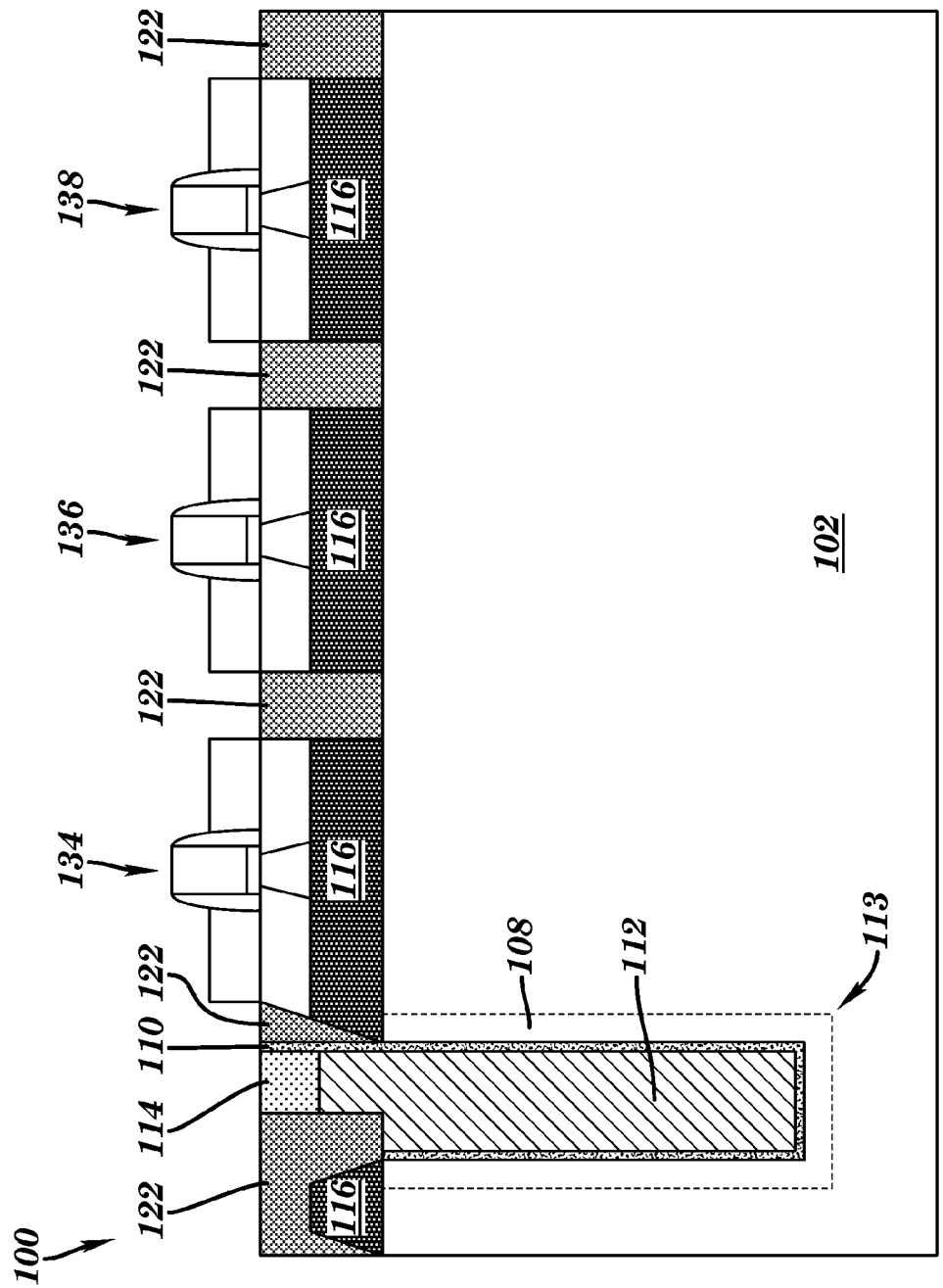

Referring now to FIG. 7, the structure 100 is shown having the deep trench capacitor 113, and multiple transistors, for example, a first transistor 134, a second transistor 136, and a third transistor 138. The deep trench capacitor 113 may be situated adjacent to the first transistor 134. The deep trench capacitor 113 and the first transistor 134 may together form, for example, an embedded DRAM memory cell. The second transistor 136 may form, but is not limited to, for example, a logic device. The third transistor 138 may form, but is not limited to, for example, an SRAM memory cell. One skilled in the art may recognize that the transistors 134, 136, and 138 may be formed in the active layer, of the SOI layer 118, FIG. 6.

Typical lithography techniques known in the art may be used to form the first transistor 134, the second transistor 136, and the third transistor 138. Additional dielectric isolation regions 122 may be formed between each of the transistors 134, 136, 138 to electrically insulate one transistor from another.

Figure 8:
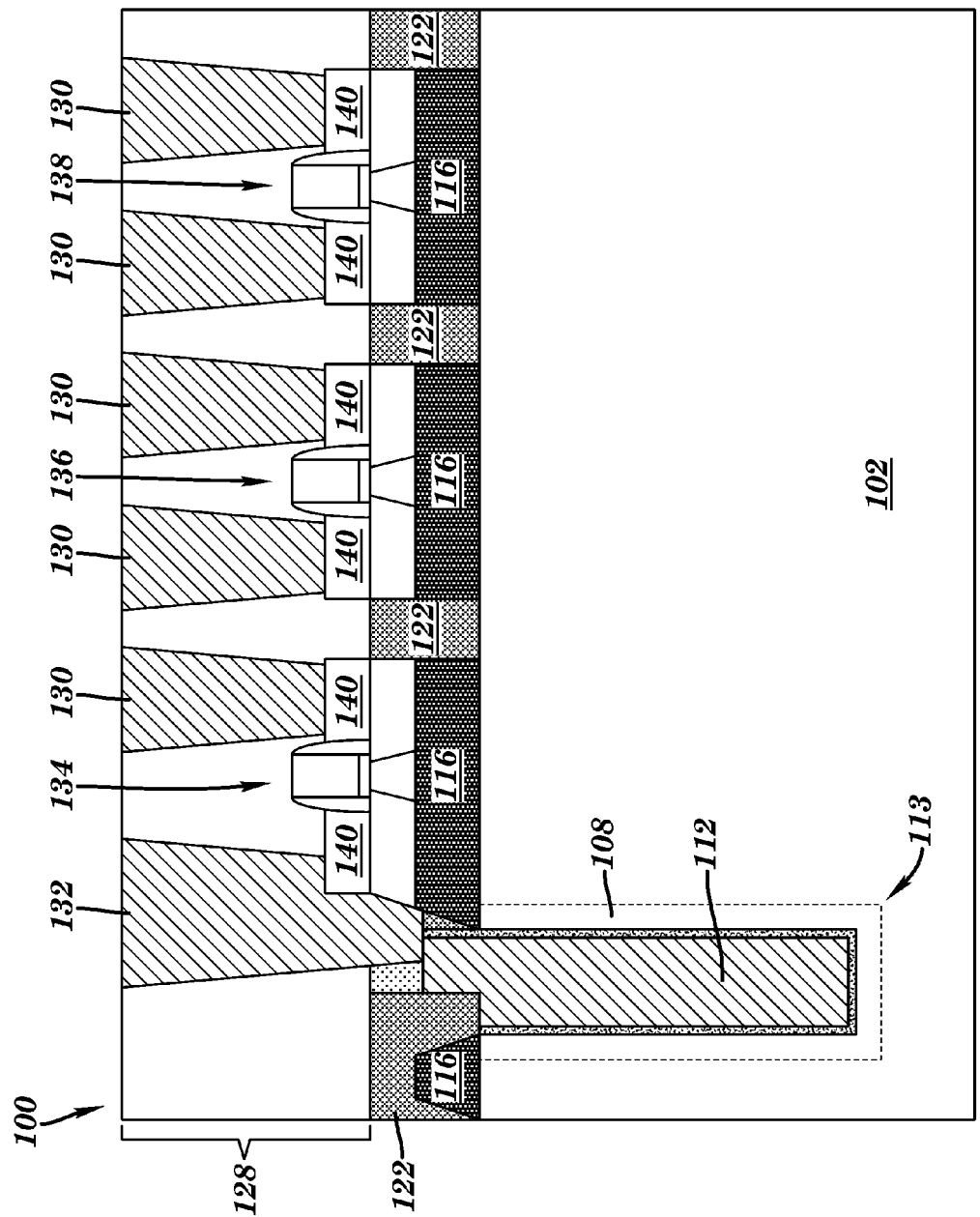

Referring now to FIG. 8, a contact-level dielectric 128 may be deposited on top of the structure 100 using any suitable deposition technique known in the art. In one embodiment, the contact-level dielectric 128 may include, but is not limited to, a material made from, a nitride, an oxide, a carbide, or any combination of these materials. In one embodiment, the contact-level dielectric 128 may include an oxide deposited using a CVD technique. The contact-level dielectric 128 may have a thickness ranging from about 20 nm to 100 nm, although a thickness of the contact-level dielectric 128 less than 20 nm or greater than 100 nm may be acceptable. The contact-level dielectric 128 may be planarized using a chemical mechanical polishing technique after being formed on top of the structure 100.

Contact trenches may then be formed by etching through the contact-level dielectric 128 to make electrical connections with the semiconductor devices formed in the SOI layer 118, FIG. 6. A first contact 130 may extend from a top surface of the contact-level dielectric 128 to a raised source/drain region 140 of a semiconductor device, for example the transistors 134, 136, or 138. A second contact 132 may extend from a top surface of the contact-level dielectric 128 and contact with the inner electrode 112 of the deep trench capacitor 113. One skilled in the art may recognize that the second contact may form an electrical connection between a source or drain region 140 of the transistor 134 and the inner electrode 112 or the deep trench capacitor 113.

With continued reference to FIG. 8, a conductive material may be deposited to fill the contact trenches and form the first and second contacts 130, 132. The conductive material may include any material having a high electrical conductivity. In one embodiment, the conductive material can include, for example, tungsten, copper, aluminum, silver, gold, alloys thereof, and any suitable combination thereof. The conductive material can be deposited by any suitable technique, including but not limited to, for example, atomic layer deposition (ALD), molecular layer deposition (MLD), chemical vapor deposition (CVD), in-situ radical assisted deposition, metalorganic chemical vapor deposition (MOCVD), molecular beam epitaxy (MBE), physical vapor deposition (PVD), sputtering, plating, evaporation, ion beam deposition, electron beam deposition, laser assisted deposition, chemical solution deposition, or any combination thereof. The thickness, or depth, of the first and second contacts 130, 132 may range from about 20 nm to about 100 nm, although lesser and greater thicknesses may also be contemplated. After deposition, a planarization process, such as for example chemical mechanical polishing, may be performed to remove any excess conductive material above the contact-level dielectric 128.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A deep trench capacitor structure in a semiconductor-on-insulator (SOI) substrate, the structure comprising:

a SOI substrate comprising a SOI layer, a rare earth oxide layer, and a bulk substrate; the rare earth oxide layer being a first epitaxial layer and being located below the SOI layer and above the bulk substrate, and the rare earth oxide layer insulating the SOI layer from the bulk substrate, the SOI layer being a second epitaxial layer; and a deep trench capacitor extending from a top surface of the SOI layer, through the rare earth oxide layer, down to a location within the bulk substrate, wherein the rare earth oxide layer contacts the deep trench capacitor at an interface between the rare earth oxide layer and the bulk substrate and from the interface the rare earth oxide layer is inclined away from the deep trench capacitor, at an angle relative to an interface of the deep trench capacitor and the bulk substrate, and wherein the SOI layer is also inclined away from the deep trench capacitor.

2. The structure of claim 1, wherein the deep trench capacitor comprises a node dielectric, an inner electrode, and a dielectric cap substantially filling the deep trench, the node dielectric being located between a buried plate and the inner electrode, the dielectric cap being located at a top of the deep trench.

3. The structure of claim 2, wherein the buried plate comprises a heavily doped region extending from a sidewall and a bottom of the deep trench into the bulk substrate.

4. The structure of claim 1, wherein the rare earth oxide layer comprises a thickness ranging from about 5 nm to about 50 nm.

5. The structure of claim 1, wherein the SOI layer comprises a thickness ranging from about 3 nm to about 10 nm.

6. The structure of claim 1, further comprising:
a semiconductor device adjacent to the deep trench capacitor; and
an electrical connection between a source or drain region of the semiconductor device and an inner electrode of the deep trench capacitor,
wherein the semiconductor device and the deep trench capacitor together form a memory cell.

7. The structure of claim 6, wherein the electrical connection comprises a contact extending from a top surface of an inter-dielectric layer to the source or drain region of the semiconductor device and the inner electrode of the deep trench capacitor.

8. The structure of claim 6, further comprising
Forming a logic device adjacent to the semiconductor device.

9. The structure of claim 1, wherein the rare earth oxide layer and the SOI layer being inclined away from the deep trench capacitor defines a space between the rare earth oxide layer and the deep trench capacitor, and between the SOI layer and the deep trench capacitor, the space being filled with a dielectric material.

10. The structure of claim 1, wherein the rare earth oxide layer being inclined away from the deep trench capacitor defines a space between the rare earth oxide layer and the deep trench capacitor, the space being filled with a dielectric material.

* * * * *